(12) United States Patent
Itoh et al.

(10) Patent No.: US 8,138,959 B2
(45) Date of Patent: Mar. 20, 2012

(54) RADIO WAVE ABSORPTION MATERIAL AND RADIO WAVE ABSORBER

(75) Inventors: Shinroh Itoh, Osaka (JP); Yasuharu Miyoshi, Osaka (JP)

(73) Assignee: Hitachi Metals, Ltd., Tokyo (JP)

( * ) Notice: Subject to any disclaimer, the term of this patent is extended or adjusted under 35 U.S.C. 154(b) by 405 days.

(21) Appl. No.: 12/440,902

(22) PCT Filed: Oct. 18, 2007

(86) PCT No.: PCT/JP2007/070319
§ 371 (c)(1),
(2), (4) Date: Mar. 11, 2009

(87) PCT Pub. No.: WO2008/047854
PCT Pub. Date: Apr. 24, 2008

(65) Prior Publication Data
US 2010/0045505 A1 Feb. 25, 2010

(30) Foreign Application Priority Data
Oct. 19, 2006 (JP) .................................. 2006-285225
Dec. 22, 2006 (JP) .................................. 2006-346591

(51) Int. Cl.
*H01Q 17/00* (2006.01)
(52) U.S. Cl. ................................................. 342/1; 342/4
(58) Field of Classification Search ............... 342/1–4
See application file for complete search history.

(56) References Cited

U.S. PATENT DOCUMENTS

| | | | | |
|---|---|---|---|---|
| 3,887,920 | A | * | 6/1975 | Wright et al. ............ 342/1 |
| 3,938,152 | A | * | 2/1976 | Grimes et al. ............ 342/1 |
| 5,446,459 | A | * | 8/1995 | Kim et al. ............ 342/1 |
| 5,872,534 | A | * | 2/1999 | Mayer ............ 342/1 |
| 5,965,056 | A | | 10/1999 | Okuyama et al. |
| 6,146,545 | A | * | 11/2000 | Murase ............ 252/62.56 |
| 6,210,597 | B1 | * | 4/2001 | Murase et al. ............ 252/62.6 |
| 6,440,323 | B1 | | 8/2002 | Kobayashi et al. |
| 6,677,881 | B1 | * | 1/2004 | Okayama ............ 342/4 |
| 6,984,338 | B2 | * | 1/2006 | Kobayashi et al. ....... 252/62.62 |
| 7,101,488 | B2 | | 9/2006 | Kobayashi et al. |
| 7,108,799 | B2 | | 9/2006 | Kobayashi et al. |
| 8,031,104 | B2 | * | 10/2011 | Janis ............ 342/1 |
| 2001/0017363 | A1 | | 8/2001 | Kobayashi et al. |
| 2004/0183048 | A1 | * | 9/2004 | Kobayashi et al. ....... 252/62.59 |
| 2004/0183049 | A1 | * | 9/2004 | Kobayashi et al. ....... 252/62.62 |
| 2004/0185289 | A1 | | 9/2004 | Kobayashi et al. |
| 2006/0219974 | A1 | * | 10/2006 | Kato ............ 252/62.63 |
| 2010/0045505 | A1 | * | 2/2010 | Itoh et al. ............ 342/1 |

FOREIGN PATENT DOCUMENTS

EP    1 101 736 A1    5/2001
(Continued)

*Primary Examiner* — John Sotomayor
(74) *Attorney, Agent, or Firm* — Birch, Stewart, Kolasch & Birch, LLP

(57) ABSTRACT

A radio wave absorption material is characterized to be obtained by firing a ferrite material that is formed by adding an accessory component, 0.1 to 2 wt % of CoO, to an oxide magnetic material containing main components, 30 to 49.5 mol % of $Fe_2O_3$, 0.5 to 20 mol % of $Mn_2O_3$, 5 to 35 mol % of ZnO, 0.2 to 15 mol % of $(Li_{0.5}Fe_{0.5})O$ and MnO as the rest. In the above-mentioned composition, part of ZnO may be replaced with 20 mol % or less of CuO. This radio wave absorption material has high strength and humidity stability and has excellent radio wave absorption performance although low in cost.

9 Claims, 10 Drawing Sheets

| | COMPOSITION (mol%) | | | | | CoO (wt%) | REFLECTION COEFFICIENT (dB) |
|---|---|---|---|---|---|---|---|
| | $Fe_2O_3$ (*) | $Mn_2O_3$ | MnO | ZnO | $(Li_{0.5}Fe_{0.5})O$ | CuO | | |
| EXAMPLE1 | 38.3 | 11.7 | 24.1 | 19.7 | 2.7 | 3.5 | 0.67 | −21 |
| EXAMPLE2 | 40.0 | 10.0 | 24.1 | 19.7 | 2.7 | 3.5 | 0.60 | −27 |
| EXAMPLE3 | 41.5 | 8.5 | 24.1 | 19.7 | 2.7 | 3.5 | 0.67 | −24 |
| EXAMPLE4 | 43.0 | 7.0 | 24.1 | 19.7 | 2.7 | 3.5 | 0.84 | −23 |
| EXAMPLE5 | 45.2 | 4.8 | 20.9 | 22.7 | 2.9 | 3.5 | 0.67 | −23 |
| EXAMPLE6 | 45.4 | 4.6 | 28.3 | 21.2 | 0.5 | 0.0 | 0.5 | −23 |
| EXAMPLE7 | 47.5 | 2.5 | 28.1 | 21.0 | 0.9 | 0.0 | 0.57 | −21 |
| COMPARISON1 | 26.0 | 24.0 | 24.1 | 19.7 | 2.7 | 3.5 | 0.20 | Tc<R.T. |
| COMPARISON2 | 51.0 | 0 | 23.1 | 19.7 | 2.7 | 3.5 | 0.85 | −16 |

*: EXCLUDING $Fe_2O_3$ IN $(Li_{0.5}Fe_{0.5})O$

FOREIGN PATENT DOCUMENTS

| | | | |
|---|---|---|---|
| EP | 1209136 A1 | 5/2002 | |
| EP | 1 447 392 A1 | 8/2004 | |
| JP | 01220899 A * | 9/1989 | |
| JP | 03165599 A * | 7/1991 | |
| JP | 04275403 A * | 10/1992 | |
| JP | 04296004 A * | 10/1992 | |
| JP | 05129123 A * | 5/1993 | |
| JP | 2794293 B2 | 9/1998 | |
| JP | 2898343 B2 | 5/1999 | |
| JP | 2001-151565 A | 6/2001 | |
| JP | 3178885 B2 | 6/2001 | |
| JP | 3278373 B2 | 4/2002 | |
| JP | 3422709 B2 | 6/2003 | |
| JP | 2003-318015 A | 11/2003 | |
| JP | 2004-247602 A | 9/2004 | |
| JP | 2004-247603 A | 9/2004 | |
| JP | 2005-235972 A | 9/2005 | |
| JP | 2005-268368 A | 9/2005 | |
| JP | 2006-193343 A | 7/2006 | |

* cited by examiner

FIG. 1

| | COMPOSITION (mol%) | | | | | | CoO (wt%) | REFLECTION COEFFICIENT (dB) |
|---|---|---|---|---|---|---|---|---|
| | Fe$_2$O$_3$ (*) | Mn$_2$O$_3$ | MnO | ZnO | (Li$_{0.5}$Fe$_{0.5}$)O | CuO | | |
| EXAMPLE1 | 38.3 | 11.7 | 24.1 | 19.7 | 2.7 | 3.5 | 0.67 | −21 |
| EXAMPLE2 | 40.0 | 10.0 | 24.1 | 19.7 | 2.7 | 3.5 | 0.60 | −27 |
| EXAMPLE3 | 41.5 | 8.5 | 24.1 | 19.7 | 2.7 | 3.5 | 0.67 | −24 |
| EXAMPLE4 | 43.0 | 7.0 | 24.1 | 19.7 | 2.7 | 3.5 | 0.84 | −23 |
| EXAMPLE5 | 45.2 | 4.8 | 20.9 | 22.7 | 2.9 | 3.5 | 0.67 | −23 |
| EXAMPLE6 | 45.4 | 4.6 | 28.3 | 21.2 | 0.5 | 0.0 | 0.5 | −23 |
| EXAMPLE7 | 47.5 | 2.5 | 28.1 | 21.0 | 0.9 | 0.0 | 0.57 | −21 |
| COMPARISON1 | 26.0 | 24.0 | 24.1 | 19.7 | 2.7 | 3.5 | 0.20 | Tc<R.T. |
| COMPARISON2 | 51.0 | 0 | 23.1 | 19.7 | 2.7 | 3.5 | 0.85 | −16 |

*: EXCLUDING Fe$_2$O$_3$ IN (Li$_{0.5}$Fe$_{0.5}$)O

F I G. 2

| | COMPOSITION (mol%) | | | | | | CoO (wt%) | REFLECTION COEFFICIENT (dB) |
|---|---|---|---|---|---|---|---|---|
| | Fe$_2$O$_3$ (*) | Mn$_2$O$_3$ | MnO | ZnO | (Li$_{0.5}$Fe$_{0.5}$)O | CuO | | |
| EXAMPLE8 | 41.5 | 8.5 | 27.2 | 17.9 | 1.4 | 3.5 | 0.64 | −23 |
| EXAMPLE9 | 41.5 | 8.5 | 25.0 | 20.1 | 1.4 | 3.5 | 0.54 | −22 |
| EXAMPLE10 | 43.0 | 7.0 | 24.1 | 20.9 | 1.4 | 3.5 | 0.67 | −25 |
| EXAMPLE11 | 45.2 | 4.8 | 20.9 | 22.7 | 2.9 | 3.5 | 0.67 | −23 |
| COMPARISON3 | 30.0 | 20.0 | 43.1 | 2.0 | 1.4 | 3.5 | 0.20 | −14 |
| COMPARISON4 | 49.5 | 0.5 | 8.1 | 37 | 1.4 | 3.5 | 0.80 | Tc<R.T. |

*: EXCLUDING Fe$_2$O$_3$ IN (Li$_{0.5}$Fe$_{0.5}$)O

FIG. 3

| | COMPOSITION (mol%) | | | | | | CoO (wt%) | REFLECTION COEFFICIENT (dB) |
|---|---|---|---|---|---|---|---|---|
| | Fe$_2$O$_3$ (*) | Mn$_2$O$_3$ | MnO | ZnO | (Li$_{0.5}$Fe$_{0.5}$)O | CuO | | |
| EXAMPLE12 | 41.5 | 8.5 | 25.0 | 20.1 | 1.4 | 3.5 | 0.54 | −22 |
| EXAMPLE13 | 41.5 | 8.5 | 24.1 | 19.7 | 2.7 | 3.5 | 0.60 | −24 |
| EXAMPLE14 | 41.5 | 8.5 | 20.0 | 21.2 | 5.3 | 3.5 | 0.80 | −22 |
| COMPARISON5 | 41.5 | 8.5 | 17.6 | 29.0 | 0.0 | 3.5 | 0.67 | Tc<R.T. |
| COMPARISON6 | 38.3 | 11.7 | 5.2 | 24.3 | 17.0 | 3.5 | 0.45 | −16 |

*: EXCLUDING Fe$_2$O$_3$ IN (Li$_{0.5}$Fe$_{0.5}$)O

F I G. 4

| | COMPOSITION (mol%) | | | | | CoO (wt%) |
|---|---|---|---|---|---|---|
| | Fe$_2$O$_3$ (*) | Mn$_2$O$_3$ | MnO | ZnO | (Li$_{0.5}$Fe$_{0.5}$)O | CuO | |
| EXPERIMENT EXAMPLE A | 41.5 | 8.5 | 25.0 | 20.1 | 1.4 | 3.5 | 0~1 |
| EXPERIMENT EXAMPLE B | 45.2 | 4.8 | 20.9 | 22.7 | 2.9 | 3.5 | 0~1.5 |
| EXPERIMENT EXAMPLE C | 45.4 | 4.6 | 31.3 | 18.2 | 0.5 | 0 | 0.3~1.3 |

*: EXCLUDING Fe$_2$O$_3$ IN (Li$_{0.5}$Fe$_{0.5}$)O

FIG. 6

| | COMPOSITION (mol%) | | | | | | CoO (wt%) | Al₂O₃ (wt%) | NiO (wt%) | Cr₂O₃ (wt%) | REFLECTION COEFFICIENT (dB) | | | AVERAGE GRAIN SIZE (μm) |
|---|---|---|---|---|---|---|---|---|---|---|---|---|---|---|
| | Fe₂O₃ (*) | Mn₂O₃ | MnO | ZnO | (Li₀.₅Fe₀.₅)O | CuO | | | | | 18°C | 25°C | 30°C | |
| EX. 15 | 48.5 | 1.5 | 20.1 | 23.7 | 2.7 | 3.5 | 1.20 | 0.0015 | 0 | 0 | -21 | -24 | -23 | 13 |
| EX. 16 | 48.5 | 1.5 | 20.1 | 23.7 | 2.7 | 3.5 | 1.20 | 0.0521 | 0 | 0 | -21 | -23 | -23 | 13 |
| EX. 17 | 48.5 | 1.5 | 20.1 | 23.7 | 2.7 | 3.5 | 1.20 | 0.1830 | 0 | 0 | -22 | -23 | -22 | 13 |
| EX. 18 | 48.5 | 1.5 | 20.1 | 23.7 | 2.7 | 3.5 | 1.20 | 0.4722 | 0 | 0 | -22 | -22 | -23 | 12 |
| COM. 7 | 48.5 | 1.5 | 20.1 | 23.7 | 2.7 | 3.5 | 1.20 | 0.0008 | 0 | 0 | -16 | -24 | -22 | 15 |
| COM. 8 | 48.5 | 1.5 | 20.1 | 23.7 | 2.7 | 3.5 | 1.20 | 0.5277 | 0 | 0 | -16 | -18 | -16 | 7 |
| EX. 19 | 48.5 | 1.5 | 20.1 | 23.7 | 2.7 | 3.5 | 1.20 | 0 | 0.0052 | 0 | -21 | -23 | -23 | 13 |
| EX. 20 | 48.5 | 1.5 | 20.1 | 23.7 | 2.7 | 3.5 | 1.20 | 0 | 0.1199 | 0 | -21 | -23 | -23 | 13 |
| EX. 21 | 48.5 | 1.5 | 20.1 | 23.7 | 2.7 | 3.5 | 1.20 | 0 | 0.7261 | 0 | -22 | -23 | -22 | 13 |
| EX. 22 | 48.5 | 1.5 | 20.1 | 23.7 | 2.7 | 3.5 | 1.20 | 0 | 0.9880 | 0 | -20 | -22 | -20 | 12 |
| COM. 9 | 48.5 | 1.5 | 20.1 | 23.7 | 2.7 | 3.5 | 1.20 | 0 | 0.0041 | 0 | -16 | -23 | -22 | 14 |
| COM. 10 | 48.5 | 1.5 | 20.1 | 23.7 | 2.7 | 3.5 | 1.20 | 0 | 1.2210 | 0 | -14 | -17 | -16 | 7 |
| EX. 23 | 48.5 | 1.5 | 20.1 | 23.7 | 2.7 | 3.5 | 1.20 | 0 | 0 | 0.0057 | -22 | -24 | -23 | 13 |
| EX. 24 | 48.5 | 1.5 | 20.1 | 23.7 | 2.7 | 3.5 | 1.20 | 0 | 0 | 0.0950 | -22 | -23 | -22 | 13 |
| EX. 25 | 48.5 | 1.5 | 20.1 | 23.7 | 2.7 | 3.5 | 1.20 | 0 | 0 | 0.3550 | -21 | -21 | -20 | 11 |
| COM. 11 | 48.5 | 1.5 | 20.1 | 23.7 | 2.7 | 3.5 | 1.20 | 0 | 0 | 0.0044 | -17 | -23 | -23 | 14 |
| COM. 12 | 48.5 | 1.5 | 20.1 | 23.7 | 2.7 | 3.5 | 1.20 | 0 | 0 | 0.4105 | -16 | -16 | -17 | 6 |
| EX. 26 | 48.5 | 1.5 | 20.1 | 23.7 | 2.7 | 3.5 | 1.20 | 0.0612 | 0.0100 | 0.0420 | -20 | -23 | -22 | 13 |
| EX. 27 | 41.5 | 8.5 | 24.1 | 19.7 | 2.7 | 3.5 | 0.67 | 0 | 0.0107 | 0.0282 | -21 | -25 | -23 | 14 |
| EX. 28 | 41.5 | 8.5 | 24.1 | 19.7 | 2.7 | 3.5 | 0.67 | 0.4155 | 0 | 0.3782 | -22 | -24 | -23 | 12 |
| EX. 29 | 41.5 | 8.5 | 24.1 | 19.7 | 2.7 | 3.5 | 0.67 | 0.0351 | 0.9652 | 0 | -20 | -23 | -21 | 14 |
| COM. 13 | 41.5 | 8.5 | 24.1 | 19.7 | 2.7 | 3.5 | 0.67 | 0 | 0.0030 | 0.0010 | -17 | -25 | -23 | 15 |
| COM. 14 | 41.5 | 8.5 | 24.1 | 19.7 | 2.7 | 3.5 | 0.67 | 0.4820 | 0 | 0.9500 | -15 | -16 | -12 | 4 |
| COM. 15 | 41.5 | 8.5 | 24.1 | 19.7 | 2.7 | 3.5 | 0.67 | 0 | 1.0330 | 0.5120 | -17 | -15 | -14 | 5 |

*: EXCLUDING Fe₂O₃ IN (Li₀.₅Fe₀.₅)O

EX.: EXAMPLE  COM.: COMPARISON

FIG. 7

| | COMPOSITION (mol%) | | | | | | CoO (wt%) | SO₃ (wt%) | Cl (wt%) | REFLECTION COEFFICIENT (dB) | PERFORMANCE DISPERSION ○:SMALL (≤2dB) ×:LARGE (>2dB) | AVERAGE GRAIN SIZE ($\mu$m) |
|---|---|---|---|---|---|---|---|---|---|---|---|---|
| | Fe₂O₃ (*) | Mn₂O₃ | MnO | ZnO | (Li₀.₅Fe₀.₅)O | CuO | | | | | | |
| EX. 30 | 41.5 | 8.5 | 22.4 | 20.5 | 3.6 | 3.5 | 0.75 | 0.0020 | 0 | -21 | ○ | 17 |
| EX. 31 | 41.5 | 8.5 | 22.4 | 20.5 | 3.6 | 3.5 | 0.75 | 0.0223 | 0 | -21 | ○ | 17 |
| EX. 32 | 41.5 | 8.5 | 22.4 | 20.5 | 3.6 | 3.5 | 0.75 | 0.0920 | 0 | -20 | ○ | 15 |
| COM. 16 | 41.5 | 8.5 | 22.4 | 20.5 | 3.6 | 3.5 | 0.75 | 0.0016 | 0 | -21 | × | 18 |
| COM. 17 | 41.5 | 8.5 | 22.4 | 20.5 | 3.6 | 3.5 | 0.75 | 0.1022 | 0 | -18 | ○ | 11 |
| EX. 33 | 41.5 | 8.5 | 22.4 | 20.5 | 3.6 | 3.5 | 0.75 | 0 | 0.0023 | -22 | ○ | 17 |
| EX. 34 | 41.5 | 8.5 | 22.4 | 20.5 | 3.6 | 3.5 | 0.75 | 0 | 0.0455 | -21 | ○ | 16 |
| EX. 35 | 41.5 | 8.5 | 22.4 | 20.5 | 3.6 | 3.5 | 0.75 | 0 | 0.0789 | -20 | ○ | 16 |
| COM. 18 | 41.5 | 8.5 | 22.4 | 20.5 | 3.6 | 3.5 | 0.75 | 0 | 0.0012 | -21 | × | 17 |
| COM. 19 | 41.5 | 8.5 | 22.4 | 20.5 | 3.6 | 3.5 | 0.75 | 0 | 0.0930 | -16 | ○ | 10 |
| EX. 36 | 41.5 | 8.5 | 24.1 | 19.7 | 2.7 | 3.5 | 0.67 | 0.0366 | 0.0080 | -24 | ○ | 16 |
| EX. 37 | 41.5 | 8.5 | 24.1 | 19.7 | 2.7 | 3.5 | 0.67 | 0.0891 | 0.0776 | -22 | ○ | 15 |
| COM. 20 | 41.5 | 8.5 | 24.1 | 19.7 | 2.7 | 3.5 | 0.67 | 0.0010 | 0.0011 | -21 | × | 17 |
| COM. 21 | 41.5 | 8.5 | 24.1 | 19.7 | 2.7 | 3.5 | 0.67 | 0.0992 | 0.0817 | -14 | ○ | 8 |

EX.: EXAMPLE    COM.: COMPARISON    *: EXCLUDING Fe₂O₃ IN (Li₀.₅Fe₀.₅)O

FIG. 8

| | COMPOSITION (mol%) | | | | | CuO | CoO (wt%) | SiO2 (wt%) | CaO (wt%) | REFLECTION COEFFICIENT (dB) | TRANSVERSE STRENGTH (MPa) | CHIPPING ○:SMALL (SIZE<5mm) ×:LARGE (SIZE≧5mm) |
|---|---|---|---|---|---|---|---|---|---|---|---|---|
| | $Fe_2O_3$ (*) | $Mn_2O_3$ | MnO | ZnO | $(Li_{0.5}Fe_{0.5})O$ | | | | | | | |
| EX. 38 | 41.5 | 8.5 | 20.0 | 19.3 | 7.2 | 3.5 | 1.05 | 0.0020 | 0 | -22 | 159 | ○ |
| EX. 39 | 41.5 | 8.5 | 20.0 | 19.3 | 7.2 | 3.5 | 1.05 | 0.0421 | 0 | -21 | 157 | ○ |
| EX. 40 | 41.5 | 8.5 | 20.0 | 19.3 | 7.2 | 3.5 | 1.05 | 0.1050 | 0 | -20 | 150 | ○ |
| EX. 41 | 41.5 | 8.5 | 20.0 | 19.3 | 7.2 | 3.5 | 1.05 | 0.2933 | 0 | -20 | 146 | ○ |
| COM. 22 | 41.5 | 8.5 | 20.0 | 19.3 | 7.2 | 3.5 | 1.05 | 0.0010 | 0 | -22 | 191 | × |
| COM. 23 | 41.5 | 8.5 | 20.0 | 19.3 | 7.2 | 3.5 | 1.05 | 0.3300 | 0 | -18 | 114 | ○ |
| EX. 42 | 41.5 | 8.5 | 20.0 | 19.3 | 7.2 | 3.5 | 1.05 | 0 | 0.0032 | -22 | 157 | ○ |
| EX. 43 | 41.5 | 8.5 | 20.0 | 19.3 | 7.2 | 3.5 | 1.05 | 0 | 0.1777 | -21 | 148 | ○ |
| EX. 44 | 41.5 | 8.5 | 20.0 | 19.3 | 7.2 | 3.5 | 1.05 | 0 | 0.2820 | -20 | 144 | ○ |
| COM. 24 | 41.5 | 8.5 | 20.0 | 19.3 | 7.2 | 3.5 | 1.05 | 0 | 0.0017 | -21 | 189 | × |
| COM. 25 | 41.5 | 8.5 | 20.0 | 19.3 | 7.2 | 3.5 | 1.05 | 0 | 0.3202 | -17 | 109 | ○ |
| EX. 45 | 41.5 | 8.5 | 20.0 | 19.3 | 7.2 | 3.5 | 1.05 | 0.0145 | 0.0116 | -21 | 154 | ○ |
| EX. 46 | 41.5 | 8.5 | 20.0 | 19.3 | 7.2 | 3.5 | 1.05 | 0.2218 | 0.2692 | -20 | 140 | ○ |
| COM. 26 | 41.5 | 8.5 | 20.0 | 19.3 | 7.2 | 3.5 | 1.05 | 0.0015 | 0.0012 | -21 | 182 | × |
| COM. 27 | 41.5 | 8.5 | 20.0 | 19.3 | 7.2 | 3.5 | 1.05 | 0.2850 | 0.2520 | -17 | 121 | ○ |
| COM. 28 | 41.5 | 8.5 | 20.0 | 19.3 | 7.2 | 3.5 | 1.05 | 0.4300 | 0.5200 | -16 | 100 | ○ |
| COM. 29 | 41.5 | 8.5 | 20.0 | 19.3 | 7.2 | 3.5 | 1.05 | 2.0100 | 0.2000 | -13 | 91 | ○ |

EX.:EXAMPLE  COM.:COMPARISON  *:EXCLUDING $Fe_2O_3$ IN $(Li_{0.5}Fe_{0.5})O$

FIG. 9

| | COMPOSITION (mol%) | | | | | | CoO (wt%) | $P_2O_5$ (wt%) | REFLEC-TION COEFFICI-ENT (dB) | RELATIVE DENSITY (%) | INTERSTAGE DISPERSION IN CHARACTER-ISTICS (dB) | TRANS-VERSE STRENGTH (MPa) |
|---|---|---|---|---|---|---|---|---|---|---|---|---|
| | $Fe_2O_3$ (*) | $Mn_2O_3$ | MnO | ZnO | $(Li_{0.5}Fe_{0.5})O$ | CuO | | | | | | |
| EX. 47 | 41.5 | 8.5 | 22.4 | 20.5 | 3.6 | 3.5 | 0.75 | 0.0012 | −21 | 98.2 | 1.7 | 169 |
| EX. 48 | 41.5 | 8.5 | 22.4 | 20.5 | 3.6 | 3.5 | 0.75 | 0.0101 | −22 | 98.1 | 1.5 | 166 |
| EX. 49 | 41.5 | 8.5 | 22.4 | 20.5 | 3.6 | 3.5 | 0.75 | 0.0359 | −21 | 98.6 | 1.5 | 170 |
| EX. 50 | 41.5 | 8.5 | 22.4 | 20.5 | 3.6 | 3.5 | 0.75 | 0.0780 | −20 | 98.6 | 1.2 | 155 |
| COM. 30 | 41.5 | 8.5 | 22.4 | 20.5 | 3.6 | 3.5 | 0.75 | 0.0003 | −20 | 95.5 | 2.9 | 132 |
| COM. 31 | 41.5 | 8.5 | 22.4 | 20.5 | 3.6 | 3.5 | 0.75 | 0.0831 | −18 | 94.1 (EXAGGER-ATED GRAIN) | 2.6 | 126 |
| COM. 32 | 41.5 | 8.5 | 22.4 | 20.5 | 3.6 | 3.5 | 0.75 | 0.1280 | −15 | 92.3 (EXAGGER-ATED GRAIN) | 2.9 | 102 |

EX.: EXAMPLE    COM.: COMPARISON    *: EXCLUDING $Fe_2O_3$ IN $(Li_{0.5}Fe_{0.5})O$

F I G. 10
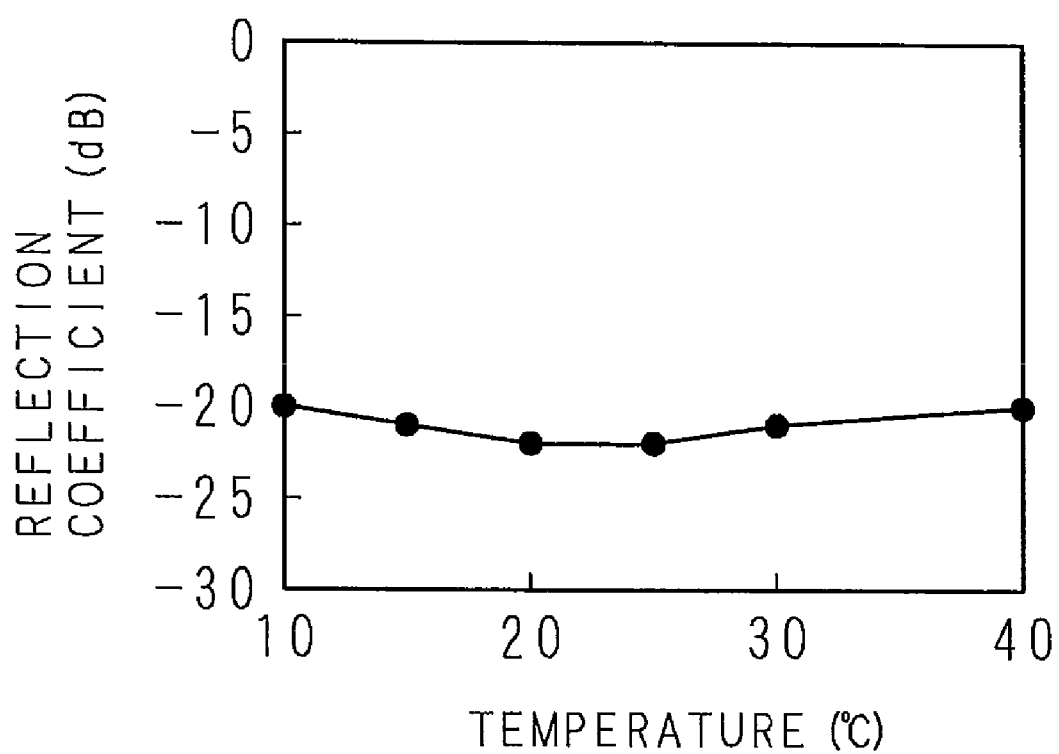

RADIO WAVE ABSORPTION MATERIAL AND RADIO WAVE ABSORBER

This application is the national phase under 35 U.S.C. §371 of PCT International Application No. PCT/JP2007/070319 which has an International filing date of Oct. 18, 2007 and designated the United States of America.

BACKGROUND

1. Technical Field

The present invention relates to a radio wave absorption material formed of a sintered ferrite material for absorbing unnecessary radio waves and to a radio wave absorber formed of the radio wave absorption material.

2. Description of Related Art

With the development of communication technology and radio guidance technology for airplanes, etc. or with the proliferation of various electric/electronic appliances, such as television sets, radios and mobile phones, for use in prevention of malfunctions in controllers, for use in noise filters for various electric/electronic appliances, for use in radio wave absorption walls or for use in radio wave anechoic chambers, radio wave absorbers matching with the respective frequency bands are demanded for the purpose of shutting off high-frequency noise that may cause unnecessary signals.

As conventional radio wave absorbers, those formed of a metal plate, thin film, carbon, etc. having conductivity and being held with rubber, plastic, etc. are generally used. In addition, an absorber made of carbonyl iron known as a magnetic absorber, an absorber combined with rubber, etc., and an absorber made of styrofoam, etc. through the use of dielectric loss are also known. Furthermore, absorbers made of composite materials obtained by combining ferrite powders, such as Ni—Zn-based and Ni—Cu—Zn-based ferrite powders, with high molecular compounds, such as rubber, silicone resin and epoxy resin, absorbers made of plastic in which metal foil pieces, such as aluminum foil pieces, are mixed, absorbers made of conductive fiber, etc. have been proposed.

In recent years, a configuration having ferrite sintered body that uses the magnetic resonance phenomenon, that is, a Ni—Cu—Zn-based sintered ferrite plate lined with a metal plate, is excellent in radio wave absorption capability and can be used as a relatively thin plate, thereby being brought into actual use. Furthermore, composite materials obtained by combining or laminating the above-mentioned various materials have also been proposed.

Such conventional radio wave absorption materials have inherent matching frequency bands; for example, a radio wave anechoic chamber for use in various experiments and measurements is required not to allow radio waves generated inside the chamber to reflect from the walls thereof and is required to shut off radio waves coming from the outside, and materials excellent in radio wave absorption capability in wide frequency bands are demanded.

Hence, various technologies have been proposed in which Ni—Cu—Zn-based ferrite sintered materials having low reflection coefficients in relatively wide bands, being able to be made into thin sheets or small pieces and being excellent in mass productivity are used as radio wave absorption materials ideally suited for various electric/electronic appliances or radio wave anechoic chambers (refer to Japanese Patent No. 2794293, Japanese Patent No. 2898343, Japanese Patent No. 3178885, Japanese Patent No. 3278373, and Japanese Patent No. 3422709).

Since NiO being expensive among main materials for use in ferrite is used in such Ni—Cu—Zn-based ferrite sintered materials, there occurs a problem that Ni—Cu—Zn-based ferrite tiles produced as radio wave absorbers are high in cost.

Hence, Mn—Zn-based ferrite sintered materials serving as radio wave absorption materials being equivalent to the Ni—Cu—Zn-based ferrite sintered materials ill performance without using such a costly main material as NiO have been proposed (refer to Japanese Patent Application Laid-Open No. 2004-247602 and Japanese Patent Application Laid-Open No. 2004-247603).

SUMMARY

However, since radio wave absorbers, in which the Mn—Zn-based ferrite sintered materials described in Patent documents 6 and 7 are used, have insulating phases formed of CaO, etc. in grain boundaries, intergranular failure is apt to occur, and the strength of the ferrite materials is lowered. In the case that the strength of the ferrite materials is low, sintered bodies are apt to be broken when they are cut or assembled, whereby not only low yield is caused but also there is a problem that they are difficult to use as radio wave absorbers for use in radio wave anechoic chambers. Furthermore, there is a problem that the change in dielectric constant with respect to humidity is significant due to water absorption in the grain boundary phases formed of CaO.

In consideration of the above-mentioned circumstances, the present invention is intended to provide a radio wave absorption material having high strength and high humidity stability and having performance equivalent to or better than that of the Ni—Cu—Zn-based ferrite sintered materials and to provide a radio wave absorber formed of the radio wave absorption material.

A radio wave absorption material according to the present invention is characterized to be obtained by firing a ferrite material that is formed by adding 0.1 to 2 wt % of CoO to an oxide magnetic material containing 30 to 49.5 mol % of $Fe_2O_3$, 0.5 to 20 mol % of $Mn_2O_3$, 5 to 35 mol % of ZnO, 0.2 to 15 mol % of $(Li_{0.5}Fe_{0.5})O$ and MnO as the rest.

The radio wave absorption material of the present invention is obtained by filing a material formed by adding an accessory component, CoO: 0.1 to 2 wt %, to an oxide magnetic material containing main components, $Fe_2O_3$: 30 to 49.5 mol %, $Mn_2O_3$: 0.5 to 20 mol %, ZnO: 5 to 35 mol %, $(Li_{0.5}Fe_{0.5})O$: 0.2 to 15 mol % and MnO: the rest. The radio wave absorption material of the present invention does not contain NiO, thereby being low in cost. Furthermore, its strength is excellent in comparison with the Mn—Zn-based ferrite sintered material described in Japanese Patent Application Laid-Open No. 2004-247602 or Japanese Patent Application Laid-Open No. 2004-247603, and change in dielectric constant due to moisture absorption is not seen. Moreover, its radio wave absorption performance is equivalent to or better than that of Ni—Cu—Zn-based ferrite sintered materials.

The radio wave absorption material according to the present invention is characterized to contain 20 mol % or less of CuO.

In the radio wave absorption material of the present invention, part of ZnO is replaced with 20 mol % or less of CuO. Low-temperature sintering is made possible by the replacement with CuO.

The radio wave absorption material according to the present invention is characterized to contain at least one of 0.001 to 0.5 wt % of $Al_2O_3$, 0.005 to 1.0 wt % of NiO and 0.005 to 0.4 wt % of $Cr_2O_3$.

In the radio wave absorption material of the present invention, at least one of $Al_2O_3$: 0.001 to 0.5 wt %, NiO: 0.005 to 1.0 wt % and $Cr_2O_3$: 0.005 to 0.4 wt % is contained as an accessory component, whereby a favorable reflection coefficient of −20 dB or less can be obtained in a wide temperature range of 18 to 30° C.

The radio wave absorption material according to the present invention is characterized to contain at least one of 0.002 to 0.095 wt % of a sulfur compound in terms of $SO_3$ and 0.002 to 0.08 wt % of a chlorine compound in terms of Cl.

In the radio wave absorption material of the present invention, at least one of a sulfur compound: 0.002 to 0.095 wt % in terms of $SO_3$ and a chlorine compound: 0.002 to 0.08 wt % in terms of Cl is contained as an accessory component, whereby it is possible to provide a sintered body having small dispersion in the high level of radio wave absorption performance.

The radio wave absorption material according to the present invention is characterized to contain at least one of 0.002 to 0.3 wt % of $SiO_2$ and 0.003 to 0.3 wt % of CaO.

In the radio wave absorption material of the present invention, at least one of $SiO_2$: 0.002 to 0.3 wt % and CaO: 0.003 to 0.3 wt % is contained as an accessory component. In the case that chipping occurs when the sintered body of the radio wave absorption material is cut, local dispersion in radio wave absorption performance occurs; hence, it is preferable that the chipping is scarce. Chipping during cutting can be suppressed from occurring by containing $SiO_2$ and/or CaO.

The radio wave absorption material according to the present invention is characterized in that in the case that the material contains both $SiO_2$ and CaO, the total amount thereof is 0.5 wt % or less.

In the radio wave absorption material of the present invention, chipping during cutting can be suppressed from occurring by setting the total amount of $SiO_2$ and CaO to 0.5 wt % or less.

The radio wave absorption material according to the present invention is characterized to contain a 0.001 to 0.08 wt % of a phosphor compound in terms of $P_2O_5$.

In the radio wave absorption material of the present invention, 0.001 to 0.08 wt % of a phosphor compound in terms of $P_2O_5$ is contained as an accessory component, whereby sinterability can be enhanced and stable sintering can be done even in the case that a large compact is sintered.

A radio wave absorber according to the present invention is characterized to be formed of the above-mentioned radio wave absorption material.

The radio wave absorber of the present invention is produced using the radio wave absorption material having the above-mentioned composition. Hence, a radio wave absorber being low in cost, excellent in reliability and having high radio wave absorption performance is obtained.

The radio wave absorber according to the present invention is characterized in that the reflection coefficient thereof for a radio wave of 30 MHz at a thickness of 8 mm or less is −20 dB or less.

In the radio wave absorber of the present invention, the reflection coefficient thereof for a radio wave of 30 MHz at a thickness of 8 mm or less is −20 dB or less. Hence, a low reflection coefficient (high absorption performance) is obtained even if the thickness thereof is small.

According to the present invention, it is possible to obtain an inexpensive radio wave absorption material having high strength and humidity stability and having radio wave absorption performance equivalent to or better than that of the Ni—Cu—Zn-based ferrite sintered bodies. Hence, a radio wave anechoic chamber having performance equivalent to or better than that of the conventional chambers can be set up at low cost by using the radio wave absorber produced using this radio wave absorption material.

The above and further objects and features will more fully be apparent from the following detailed description with accompanying drawings.

BRIEF DESCRIPTION OF THE SEVERAL VIEWS OF THE DRAWINGS

FIG. 1 is a table showing the compositions and the reflection coefficients in the radio wave absorption materials of Examples 1 to 7 and Comparison examples 1 and 2;

FIG. 2 is a table showing the compositions and the reflection coefficients in the radio wave absorption materials of Examples 8 to 11 and Comparison examples 3 and 4;

FIG. 3 is a table showing the compositions and the reflection coefficients in the radio wave absorption materials of Examples 12 to 14 and Comparison examples 5 and 6;

FIG. 4 is a table showing the compositions in the radio wave absorption materials of Experiment examples A, B and C;

FIG. 6 is a table showing the compositions, the reflection coefficients and the average grain size of the radio wave absorption materials of Examples 15 to 29 and Comparison examples 7 to 15;

FIG. 7 is a table showing the compositions, the reflection coefficients, the dispersion in radio wave absorption performance and the average grain size of the radio wave absorption materials of Examples 30 to 37 and Comparison examples 16 to 21;

FIG. 8 is a table showing the compositions, the reflection coefficients, the transverse strength and the degree of chipping in the radio wave absorption materials of Examples 38 to 46 and Comparison examples 22 to 29;

FIG. 9 is a table showing the compositions, the reflection coefficients, the relative density of the sintered body, the interstage dispersion in characteristics and the transverse strength in the radio wave absorption materials of Examples 47 to 50 and Comparison examples 30 to 32; and FIG. 10 is a graph showing the relationship between the temperature and the reflection coefficient in the radio wave absorption material of an example.

DETAILED DESCRIPTION

Figure 5:
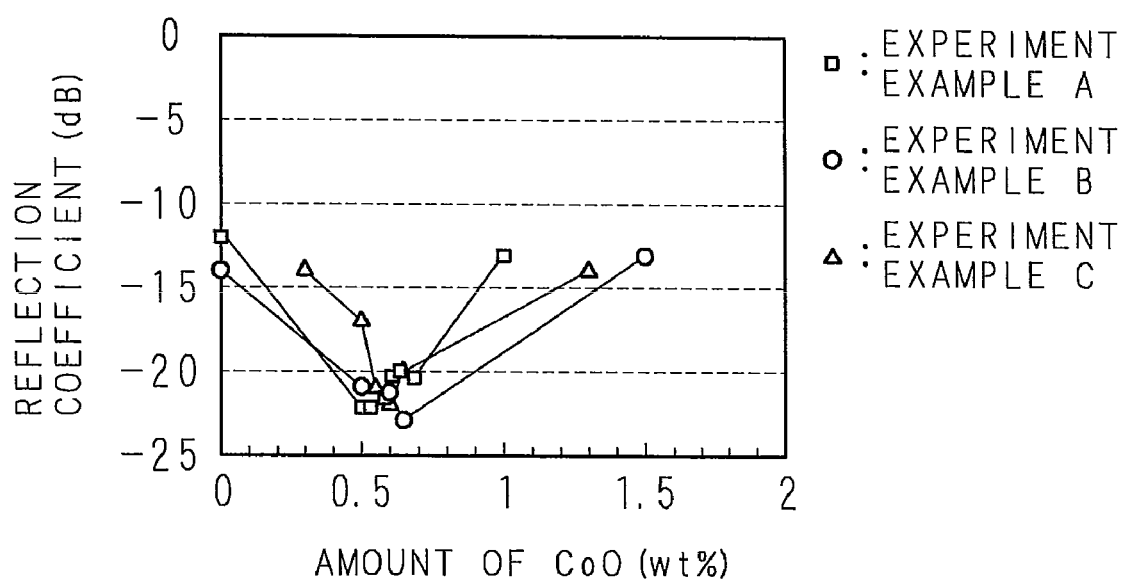
FIG. 5 is a graph showing the relationship between the wt % of CoO and the reflection coefficient in Experiment examples A, B and C.

A radio wave absorption material according to the present invention is obtained by adjusting components Fe, Mn, Zn and Li serving as main components so as to have ratios in terms of the respective oxides, that is, $Fe_2O_3$: 30 to 49.5 mol %, $Mn_2O_3$: 0.5 to 20 mol %, ZnO: 5 to 35 mol %, $(Li_{0.5}Fe_{0.5})O$: 0.2 to 15 mol % and MnO: the rest, by adding CoO: 0.1 to 2 wt % and by performing firing to form a ferrite compact.

Part of ZnO may be replaced with 20 mol % or less of CuO in the composition of the above-mentioned main components.

The reason why the composition values of the respective oxides are restricted will be described below.

($Fe_2O_3$: 30 to 49.5 mol %)

In the Case that $F_2O_3$ is Less than 30 Mol %, the Material is not Practical since Tc (Curie temperature) lowers. On the other hand, in the case that $Fe_2O_3$ is more than 49.5 mol %, the specific resistance of the material lowers, whereby the dielectric constant thereof increases and the radio wave absorption performance thereof is degraded.

($Mn_2O_3$: 0.5 to 20 mol %)

In a Spinel Ferrite Material Made of Metal Oxides, the Ratio of Trivalent metal oxides is generally made equal to the ratio of divalent metal oxides. Hence, since $Fe_2O_3$ and $Mn_2O_3$, trivalent metal oxides, are mixed so that the total amount thereof is 50 mol % in the composition according to the present invention, the amount of $Mn_2O_3$ is determined depending on the amount of $Fe_2O_3$. Since the amount of $Fe_2O_3$ is 30 to 49.5 mol % as described above, the amount of $Mn_2O_3$ becomes 0.5 to 20 mol % depending thereon.

(ZnO: 5 to 35 Mol %)

In the case that ZnO is less than 5 mol %, $\mu'$ (the real part of complex relative magnetic permeability) becomes higher as Tc rises, and the radio wave absorption performance of the material is degraded. On the other hand, in the case that ZnO is more than 35 mol %, $\mu''$ (the imaginary part of complex relative magnetic permeability) becomes lower, and no sufficient radio wave absorption effect is obtained.

(($Li_{0.5}Fe_{0.5}$)O: 0.2 to 15 mol %)

In the case that ($Li_{0.5}Fe_{0.5}$)O is less than 0.2 mol %, $\mu''$ becomes lower, and no sufficient radio wave absorption performance is obtained. On the other hand, in the case that ($Li_{0.5}Fe_{0.5}$)O is more than 15 mol %, $\mu'$ becomes higher as Tc rises, and the radio wave absorption performance of the material is degraded.

(CuO: 20 Mol % or Less)

ZnO may be replaced with CuO to perform low-temperature sintering. However, in the case that the replacement is performed such that the amount is more than 20 mol %, no sufficient radio wave absorption performance is obtained, whereby the upper limit of the amount of the replacement is 20 mol %.

(MnO: the Rest)

In order that the total amount of $Fe_2O_3$, $Mn_2O_3$, ZnO, ($Li_{0.5}Fe_{0.5}$)O, CuO and MnO becomes 100 mol %, MnO is contained as the rest corresponding to the respective specified amounts of the above-mentioned $Fe_2O_3$, $Mn_2O_3$, ZnO, ($Li_{0.5}Fe_{0.5}$)O and CuO.

(CoO: 0.1 to 2 Wt %)

In the case that CoO is less than 0.1 wt %, high $\mu''$ is not obtained, and no sufficient radio wave absorption effect is obtained. On the other hand, in the case that CoO is more than 2 wt %, $\mu'$ becomes higher, and the radio wave absorption performance of the material is degraded.

At least one of 0.001 to 0.5 wt % of $Al_2O_3$, 0.005 to 1.0 wt % of NiO and 0.005 to 0.4 wt % of $Cr_2O_3$; at least one of 0.002 to 0.095 wt % of a sulfur compound in terms of $SO_3$ and 0.002 to 0.08 wt % of a chlorine compound in terms of Cl; at least one of 0.002 to 0.3 wt % of $SiO_2$ and 0.003 to 0.3 wt % of CaO; and 0.001 to 0.08 wt % of a phosphor compound in terms of $P_2O_5$ are contained in the radio wave absorption material having the above-mentioned composition. The reason why the values (wt %) of these accessory components to be added are restricted will be described below.

($Al_2O_3$: 0.001 to 0.5 wt %, NiO: 0.005 to 1.0 wt %, $Cr_2O_3$: 0.005 to 0.4 wt %)

A favorable reflection coefficient of −20 dB or less in a wide temperature range of 18 to 30° C. can be obtained by containing the accessory components having values in the above-mentioned ranges. In the case that the contents of any of these accessory components are less than the above-mentioned lower limit values, this effect is not obtained. On the other hand, in the case that the contents of any of these accessory components are more than the above-mentioned upper limit values, the crystal grain size of the material becomes minute, and the soft magnetic characteristics thereof are degraded.

(Sulfur Compound: 0.002 to 0.095 wt % in Terms of $SO_3$ and Chlorine Compound: 0.002 to 0.08 wt % in Terms of Cl)

A sintered body having small dispersion in the high level of radio wave absorption characteristics can be obtained by containing the accessory components having values in the above-mentioned ranges. In the case that the contents of any of these accessory components are less than the above-mentioned lower limit values, this effect is not obtained. On the other hand, in the case that the contents of any of these accessory components are more than the above-mentioned upper limit values, the crystal grain size of the material becomes minute, and the radio wave absorption characteristics thereof are degraded as $\mu'$ rises.

($SiO_2$: 0.002 to 0.3 wt % and CaO: 0.003 to 0.3 wt %)

Chipping when the sintered body is cut can be suppressed from occurring by containing the accessory components having values in the above-mentioned ranges. In the case that the contents of any of these accessory components are less than the above-mentioned lower limit values, this effect is not obtained. On the other hand, in the case that the contents of any of these accessory components are more than the above-mentioned upper limit values, the thickness of the grain boundary phase increases and the crystal grain size becomes minute, whereby the material eventually has a structure in which intergranular failure advances significantly and the strength of the radio wave absorption material lowers.

($SiO_2$+CaO: 0.5 wt % or Less)

Chipping can be suppressed from occurring by setting the total amount of $SiO_2$ and CaO to a value in the above-mentioned range. In the case that the total amount is more than the above-mentioned upper limit value, the thickness of the grain boundary phase increases and the crystal grain size becomes minute, whereby the material eventually has a structure in which intergranular failure advances significantly and the strength of the radio wave absorption material lowers.

(Phosphor Compound: 0.001 to 0.08 wt % in Terms of $P_2O_5$)

The sinterability of the material can be improved by containing a phosphor compound having a value in the above-mentioned range. In the case that the content of the phosphor compound is less than the above-mentioned lower limit value, this effect is not obtained. On the other hand, in the case that the content of the phosphor compound is more than the above-mentioned upper limit value, the growth of crystal grain size is nonuniform and advances excessively, that is, exaggerated grain growth occurs, whereby the soft magnetic characteristics are degraded and the mechanical strength lowers.

However, since the contents of the above-mentioned respective accessory components according to the present invention are scarce, there is no problem in strength and humidity stability described in Patent documents 6 and 7, whereby a radio wave absorption material having high strength and humidity stability is obtained.

Next, various Examples and Comparison examples of radio wave absorption materials, in which the composition ratios of various metal oxides were changed, were produced, and the performance values (reflection coefficients) of radio wave absorbers formed of the produced radio wave absorption materials were measured; the results of the measurement are described. The production conditions and performance (reflection coefficient) measurement conditions for the radio wave absorption materials in these Examples and Comparison examples are determined as described below.

Raw powders were mixed so that composition ratios described later were obtained finally, and the powders were calcinated temporarily fired in atmospheric air at 850° C. for 3 hours. The obtained calcinated powders were wet-milled using a ball mill and then dried. To the powders obtained after the drying, 7 wt % solution of polyvinyl alcohol was added at 14 wt %, and a granular powder was obtained. The granular powder was molded into a compact having a disc shape measuring 62 mm in diameter×10 mm in thickness at 1.5 ton/cm². The obtained compact was heated to 1300° C. at a rate of 150° C./hour or less in the atmospheric air, and the temperature was kept for 3 hours. Then, the atmosphere was changed to a nitrogen atmosphere, and the temperature was lowered to room temperature at a rate of 200° C./hour or less. A ring-shaped test piece measuring approximately 39 mm in outside diameter×approximately 17 mm in inside diameter×6.7 mm in thickness was cut out from the obtained disc-shaped sintered body, and the impedance of the test piece was measured using a network analyzer.

When the impedance-matching thickness is 6.7 mm or more, a test piece with thickness of 6.7 mm is used and the reflection coefficient for a radio wave of 30 MHz was measured by the network analyzer. When the impedance-matching thickness is less than 6.7 mm, a test piece was further subjected to grinding so as to have a thickness equal to the impedance-matching thickness and then the reflection coefficient was measured.

FIG. 1 is a table showing the compositions of the respective metal oxides and the measured reflection coefficients for a radio wave of 30 MHz in the radio wave absorption materials of Examples 1 to 7 and Comparison examples 1 and 2. In the combinations in these Examples 1 to 7 and Comparison examples 1 and 2, the composition ratio of $Fe_2O_3$ is made different.

In all of Examples 1 to 7 in which the condition of $Fe_2O_3$: 30 to 49.5 mol % is satisfied, reflection coefficients of −20 dB or less can be attained. On the other hand, in Comparison example 1 in which the composition ratio of $Fe_2O_3$ is 26 mol %, Tc (Curie temperature) is lower than R.T. (room temperature). In addition, in Comparison example 2 in which the composition ratio of $Fe_2O_3$ is 51 mol %, the reflection coefficient is −16 dB, being low in radio wave absorption performance. It is assumed that this was caused because the specific resistance of the material decreased and the dielectric constant increased.

FIG. 2 is a table showing the compositions of the respective metal oxides and the measured reflection coefficients for a radio wave of 30 MHz in the radio wave absorption materials of Examples 8 to 11 and Comparison examples 3 and 4. In the combinations in these Examples 8 to 11 and Comparison examples 3 and 4, the composition ratio of ZnO is made different.

In all of Examples 8 to 11 in which the condition of ZnO: 5 to 35 mol % is satisfied, reflection coefficients of −20 dB or less can be attained. On the other hand, in Comparison example 3 in which the composition ratio of ZnO is 2 mol %, the reflection coefficient is −14 dB, being low in radio wave absorption performance. It is assumed that this was caused because Tc was raised and µ' became higher. In addition, in Comparison example 4 in which the composition ratio of ZnO is 37 mol %, Tc is lower than R.T.

FIG. 3 is a table showing the compositions of the respective metal oxides and the measured reflection coefficients for a radio wave of 30 MHz in the radio wave absorption materials of Examples 12 to 14 and Comparison examples 5 and 6. In the combinations in these Examples 12 to 14 and Comparison examples 5 and 6, the composition ratio of $(Li_{0.5}Fe_{0.5})O$ is made different.

In all of Examples 12 to 14 in which the condition of $(Li_{0.5}Fe_{0.5})O$: 0.2 to 15 mol % is satisfied, reflection coefficients of −20 dB or less can be attained. On the other hand, in Comparison example 5 in which the composition ratio of $(Li_{0.5}Fe_{0.5})O$ is 0 mol %, Tc is lower than R.T. In addition, in Comparison example 6 in which the composition ratio of $(Li_{0.5}Fe_{0.5})O$ is 17 mol %, the reflection coefficient is −16 dB, and only low radio wave absorption performance is obtained. It is assumed that this was caused because Tc was raised and µ' became high.

FIG. 4 is a table showing the compositions of the respective metal oxides in the radio wave absorption materials of Experiment examples A, B and C. In addition, FIG. 5 is a graph showing the relationship between the wt % of CoO and the measured reflection coefficient for a radio wave of 30 MHz in the case that the wt % of CoO was changed in Experiment examples A, B and C.

In Experiment examples A, B and C being different in the composition ratios of the main components, the dependence of the reflection coefficient on the wt % of CoO tends to become different; however, in the composition ranges of the main components in the present invention, it is found that the lowest reflection coefficient (most favorable radio wave absorption performance) is obtained in the case that the wt % of CoO is 0.1 to 2 wt %.

The reflection coefficients of all the radio wave absorption materials in Examples 1 to 14 in which the conditions of the composition ratios of the present invention are satisfied are −20 dB or less as described above, and it is found that ferrite sintered bodies having excellent radio wave absorption performance are obtained according to the present invention. Furthermore, although the reflection coefficients for a radio wave of 30 MHz have been described, excellent radio wave absorption performance values (reflection coefficients of −20 dB or less) are obtained for a radio wave having a frequency band of 30 to several hundred MHz required for radio wave anechoic chambers.

By the way, it can be confirmed that µ' (the real part of complex relative magnetic permeability) is 50 or less and µ" (the imaginary part of complex relative magnetic permeability) is 200 or more in all the radio wave absorption materials in Examples 1 to 14 described above, whereby the materials have characteristics so as to serve as excellent radio wave absorption materials.

Next, various Examples and Comparison examples of radio wave absorption materials, in which the content wt % values of accessory components were changed were produced, and the characteristics of various radio wave absorbers formed of the produced radio wave absorption materials were measured; the results of the measurement are described. The production conditions and reflection coefficient measurement conditions for the radio wave absorption materials in these Examples and Comparison examples are similar to those described above.

FIG. 6 is a table showing the compositions, the reflection coefficients for a radio wave of 30 MHz at 18 to 30° C. and the average grain size of the radio wave absorption materials of Examples 15 to 29 and Comparison examples 7 to 15. In the combinations in these Examples 15 to 27 and Comparison examples 7 to 15, the content (wt %) of at least one of $Al_2O_3$, NiO and $Cr_2O_3$ is made different.

In all of Examples in which the conditions of $Al_2O_3$: 0.001 to 0.5 wt %, NiO: 0.005 to 1.0 wt % and $Cr_2O_3$: 0.005 to 0.4 wt % are satisfied, it is found that favorable reflection coefficients of −20 dB or less are maintained in a wide temperature range of 18 to 30° C. while the average temperature inside the radio wave anechoic chamber is set at 25° C. On the other hand, temperature ranges in which reflection coefficients of −20 dB or less are not obtained are present in the respective Comparison examples.

FIG. 7 is a table showing the compositions, the reflection coefficients for a radio wave of 30 MHz, the dispersion in radio wave absorption performance and the average grain size of the radio wave absorption materials of Examples 30 to 37 and Comparison examples 16 to 21. In the combinations in these Examples 30 to 37 and Comparison examples 16 and 21, the content of at least one of the sulfur compound and the chlorine compound (wt % in terms of $SO_3$, wt % in terms of Cl) is made different.

The dispersion in the radio wave absorption performance was measured as described below. On the basis of the difference between the highest and lowest reflection coefficient values in each of 30 sintered bodies sintered at the same time, the magnitude of the dispersion in the radio wave absorption performance among the sintered bodies was evaluated. More specifically, in the case that the difference between the highest and lowest reflection coefficient values was 2 dB or less, the dispersion in the radio wave absorption performance was evaluated small (○ in FIG. 7), and in the case that the difference was more than 2 dB, the dispersion in the radio wave absorption performance was evaluated large (x in FIG. 7).

In all of Examples in which the condition of a sulfur compound: 0.002 to 0.095 wt % in terms of $SO_3$ and a chlorine compound: 0.002 to 0.08 wt % in terms of Cl is satisfied, favorable reflection coefficients of −20 dB or less can be attained, and it is found that the dispersion in radio wave absorption performance (reflection coefficient) is small. On the other hand, in Comparison examples, reflection coefficients of −20 dB or less cannot be obtained, or even if the reflection coefficients are obtained, the dispersion in radio wave absorption performance (reflection coefficient) is large.

FIG. 8 is a table showing the compositions, the reflection coefficients for a radio wave of 30 MHz, the transverse strength and the degree of chipping in the radio wave absorption materials of Examples 38 to 46 and Comparison examples 22 to 29. In the combinations in these Examples 38 to 46 and Comparison examples 22 to 29, the content (wt %) of at least one of $SiO_2$ and CaO is made different.

The transverse strength values are obtained as the measurement results of the three-point bending test conforming to JIS-R1601. Furthermore, with respect to the degree of chipping, in the case that the size of the chipping occurred at the end portion of the test piece was less than 5 mm when the test piece was processed in the direction of the thickness thereof using a double-side grinding machine equipped with #120 grinding stones, the chipping was evaluated small (○ in FIG. 8), and in the case that the size was 5 mm or more, the chipping was evaluated large (x in FIG. 8).

In all of Examples 38 to 44 in which $SiO_2$ or CaO is contained and the conditions of $SiO_2$: 0.002 to 0.3 wt % and CaO: 0.003 to 0.3 wt % are satisfied, it is found that favorable reflection coefficient of −20 dB or less can be attained and that chipping rarely occurs during grinding while a high transverse strength of approximately 140 to 160 MPa is maintained. On the other hand, in Comparison examples 22 to 25 in which $SiO_2$ or CaO is contained, the contents thereof being outside the above-mentioned ranges, reflection coefficients of −20 dB or less are not obtained or even if the reflection coefficients are obtained, large chipping occurs during grinding.

In addition, in Examples 45 and 46 in which both $SiO_2$ and CaO are contained and the condition of the total amount thereof being 0.5 wt % or less is satisfied, favorable reflection coefficients of −20 dB or less can be attained, and chipping rarely occurs during grinding while a high transverse strength of approximately 140 to 160 MPa is maintained. On the other hand, in Comparison examples 27 to 29 in which the total amount of $SiO_2$ and CaO is more than 0.5 wt %, reflection coefficients of −20 dB or less are not obtained. Furthermore, even if the total amount of $SiO_2$ and CaO is 0.5 wt % or less, in Comparison example 26 in which the contents of $SiO_2$ and CaO are outside the above-mentioned ranges, large chipping occurs during grinding.

FIG. 9 is a table showing the compositions, the reflection coefficients for a radio wave of 30 MHz, the relative density of the sintered body, the interstage dispersion in characteristics and the transverse strength in the radio wave absorption materials of Examples 47 to 50 and Comparison examples 30 to 32. In the combinations in these Examples 47 to 50 and Comparison examples 30 to 32, the content of the phosphor compound (wt % in terms of $P_2O_5$) is made different.

The sinterability can be evaluated by comparing the relative density values of the obtained sintered bodies. More specifically, in the case that the relative density values are 98% or more, the sinterability can be evaluated good, and in the case that the relative density values are less than 98%, the sinterability can be evaluated bad.

The interstage dispersion in characteristics (the dispersion in the performance of the sintered bodies) was evaluated according to the method described below. A five-stage sintering shelf was formed in a furnace by combining plates measuring 150 mm×150 mm×5 mm in thickness and spacers measuring 15 mm×15 mm×15 mm, both being made of refractory materials, each one of compacts obtained by performing molding into a disc shape measuring 62 mm in diameter×10 mm in thickness at 1.5 ton/cm$^2$ was placed on each stage, and the compact was fired under the above-mentioned conditions. Then, ring-shaped test pieces were cut out in a way similar to that described above, and the impedance values thereof were measured. Furthermore, the reflection coefficients for a radio wave of 30 MHz were measured under the above-mentioned measurement conditions and the dispersion values in the reflection coefficients of the sintered bodies obtained in the respective stages were compared and evaluated. In the case of a test piece having a matching thickness of more than 6.7 mm, the measured value at 6.7 mm was used for comparison; in the case of a test piece having a matching thickness of less than 6.7 mm, it was subjected to grinding so as to have a matching thickness, and the measured value at the thickness was used for comparison. More specifically, on the basis of the difference between the highest and lowest reflection coefficient values in 5 sintered bodies obtained by performing firing at the same time on the five-stage shelf, the dispersion in the measured values (reflection coefficients) was evaluated; that is, in the case that the difference was less than 2 dB, the dispersion was evaluated small, and in the case that the difference was 2 dB or more, the dispersion was evaluated large.

The transverse strength values are obtained as the measurement results of the three-point bending test conforming to JIS-R1601, just as in the above-mentioned examples.

In all of Examples in which the condition of a phosphor compound: 0.001 to 0.08 wt % in terms of $P_2O_5$ is satisfied, favorable reflection coefficients of −20 dB or less can be attained. In addition, since a proper amount of the phosphor compound is contained, excellent sinterability, characterized in that the relative density is 98% or more, is attained. Furthermore, the interstage dispersion in reflection coefficient is less than 2 dB and thus small. Moreover, as the transverse strength, a high value of 150 MPa or more is obtained. On the other hand, in the respective Comparison examples, the sinterability is bad, the transverse strength is low, and the interstage dispersion in reflection coefficient is large.

As another example according to the present invention, a radio wave absorption material, comprising main components, $Fe_2O_3$: 41.5 mol %, $Mn_2O_3$: 8.5 mol %, MnO: 24.1 mol %, ZnO: 19.7 mol %, $(Li_{0.5}Fe_{0.5})O$: 2.7 mol % and CuO: 3.5 mol % and further containing accessory components, CoO: 0.67 wt %, $Cr_2O_3$: 0.028 wt %, a sulfur compound: 0.065 wt % in terms of $SO_3$, $SiO_2$: 0.013 wt % and a phosphor compound: 0.026 wt % in terms of $P_2O_5$, has a favorable reflection coefficient of −20 dB or less in a wide temperature range of 18 to 30° C., is satisfactory in sinterability, and is free from the problems of dispersion in performance and the occurrence of chipping during cutting, whereby both excellent radio wave absorption performance and excellent production stability can be attained.

In addition, a radio wave absorption material containing all of $Al_2O_3$, NiO, $Cr_2O_3$, a sulfur compound, a chlorine compound, $SiO_2$, CaO and a phosphor compound, having values in the above-mentioned predetermined ranges, as accessory components can attain all of the following: a favorable reflection coefficient of −20 dB or less in a wide temperature range of 18 to 30° C., small dispersion in the high level of radio wave absorption characteristics, suppression of chipping occurrence and stable sintering of large compacts.

As still another example according to the present invention, a radio wave absorption material comprising main components, $Fe_2O_3$: 45.2 mol %, $Mn_2O_3$: 4.8 mol %, MnO: 29.8 mol %, ZnO: 19.1 mol % and $(Li_{0.5}Fe_{0.5})O$: 1.1 mol %, further containing accessory components, CoO: 0.55 wt %, $Al_2O_3$: 0.006 wt %, NiO: 0.012 wt % and $Cr_2O_3$: 0.013 wt %, and having an average grain size of 13 μm was produced, and the reflection coefficient for a radio wave of 30 MHz in a radio wave absorber formed of the produced radio wave absorption material was measured in a temperature range of 10 to 40° C. The measurement results are shown in FIG. 10. This example has a favorable reflection coefficient of −20 dB or less in the wide temperature range of 10 to 40° C.

As this invention may be embodied in several forms without departing from the spirit of essential characteristics thereof, the present embodiments are therefore illustrative and not restrictive, since the scope of the invention is defined by the appended claims rather than by description preceding them, and all changes that fall within metes and bounds of the claims, or equivalence of such metes and bounds thereof are therefore intended to be embrace by the claims.

What is claimed is:

1. A radio wave absorption material being characterized to be obtained by firing a ferrite material that is formed by adding 0.1 to 2 wt % of CoO to an oxide magnetic material containing 30 to 49.5 mol % of $Fe_2O_3$, 0.5 to 20 mol % of $Mn_2O_3$, 5 to 35 mol % of ZnO, 0.2 to 15 mol % of $(Li_{0.5}Fe_{0.5})O$ and MnO as the rest.

2. The radio wave absorption material according to claim 1, wherein said oxide magnetic material contains 20 mol % or less of CuO.

3. The radio wave absorption material according to claim 1, containing at least one of 0.001 to 0.5 wt % of $Al_2O_3$, 0.005 to 1.0 wt % of NiO and 0.005 to 0.4 wt % of $Cr_2O_3$.

4. The radio wave absorption material according to claim 1, containing at least one of 0.002 to 0.095 wt % of a sulfur compound in terms of $SO_3$ and 0.002 to 0.08 wt % of a chlorine compound in terms of Cl.

5. The radio wave absorption material according to claim 1, containing at least one of 0.002 to 0.3 wt % of $SiO_2$ and 0.003 to 0.3 wt % of CaO.

6. The radio wave absorption material according to claim 5, wherein in the case that said material contains both $SiO_2$ and CaO, the total amount thereof is 0.5 wt % or less.

7. The radio wave absorption material according to claim 1, containing a 0.001 to 0.08 wt % of a phosphor compound in terms of $P_2O_5$.

8. A radio wave absorber formed of said radio wave absorption material according to claim 1.

9. The radio wave absorber according to claim 8, wherein the reflection coefficient thereof for a radio wave of 30 MHz at a thickness of 8 mm or less is −20 dB or less.

* * * * *